(12) United States Patent
Dernovsek et al.

(10) Patent No.: US 10,225,965 B2
(45) Date of Patent: Mar. 5, 2019

(54) ELECTRONIC COMPONENT AND USE THEREOF

(71) Applicant: EPCOS AG, Munich (DE)

(72) Inventors: Oliver Dernovsek, Lieboch (AT); Thomas Feichtinger, Graz (AT)

(73) Assignee: EPCOS AG, Munich (DE)

( * ) Notice: Subject to any disclaimer, the term of this patent is extended or adjusted under 35 U.S.C. 154(b) by 46 days.

(21) Appl. No.: 15/100,283

(22) PCT Filed: Nov. 25, 2014

(86) PCT No.: PCT/EP2014/075562
§ 371 (c)(1),
(2) Date: May 27, 2016

(87) PCT Pub. No.: WO2015/078873
PCT Pub. Date: Jun. 4, 2015

(65) Prior Publication Data
US 2017/0006741 A1   Jan. 5, 2017

(30) Foreign Application Priority Data

Nov. 29, 2013 (DE) .......................... 10 2013 113 264
Jan. 16, 2014 (DE) .......................... 10 2014 100 469

(51) Int. Cl.
*H01L 33/60* (2010.01)
*H01L 23/552* (2006.01)
(Continued)

(52) U.S. Cl.
CPC ............. *H05K 9/0081* (2013.01); *H01C 1/06* (2013.01); *H01G 2/22* (2013.01); *H01G 4/224* (2013.01); *H01L 23/552* (2013.01); *H01L 25/167* (2013.01); *H01L 33/60* (2013.01); *H01L 41/0533* (2013.01); *H01C 7/02* (2013.01); *H01C 7/04* (2013.01); *H01C 7/10* (2013.01); *H01C 7/18* (2013.01); *H01G 4/30* (2013.01); *H01L 2224/0401* (2013.01);
(Continued)

(58) Field of Classification Search
CPC .................................................... H05K 9/0081
See application file for complete search history.

(56) References Cited

U.S. PATENT DOCUMENTS 4,020,345 A * 4/1977 Meyer ................ G01N 21/3504
250/343
5,004,339 A * 4/1991 Pryor ..................... G01B 11/00
250/559.39
(Continued)

FOREIGN PATENT DOCUMENTS

DE     4138665 A1    6/1992
DE     4415950 A1   11/1995
(Continued)

*Primary Examiner* — Moazzam Hossain
(74) *Attorney, Agent, or Firm* — Morgan, Lewis & Bockius LLP (57) ABSTRACT

What is specified is an electronic component (100) comprising a functional body (1) provided with a reflection structure (2) wherein the reflection structure (2) is arranged and designed to reflect radiation that impinges on the electronic component (100) from outside away from the functional body (1) and wherein the electronic component (100) is radiation-passive.

19 Claims, 3 Drawing Sheets (51) Int. Cl.
*H01L 25/16* (2006.01)
*H01L 41/053* (2006.01)
*H05K 9/00* (2006.01)
*H01C 1/06* (2006.01)
*H01G 2/22* (2006.01)
*H01G 4/224* (2006.01)
*H01G 4/30* (2006.01)
*H01C 7/18* (2006.01)
*H01C 7/02* (2006.01)
*H01C 7/04* (2006.01)
*H01C 7/10* (2006.01)

(52) U.S. Cl.
CPC ........... *H01L 2224/16225* (2013.01); *H01L 2924/10252* (2013.01); *H01L 2924/10253* (2013.01); *H01L 2924/10329* (2013.01); *H01L 2924/12041* (2013.01); *H01L 2924/15311* (2013.01); *H01L 2924/15313* (2013.01)

(56) References Cited

U.S. PATENT DOCUMENTS

| | | | |
|---|---|---|---|
| 6,278,601 B1 | 8/2001 | Price | |
| 2005/0145405 A1* | 7/2005 | Chen | H01G 2/22 174/384 |
| 2007/0075323 A1* | 4/2007 | Kanazawa | H01L 25/167 257/98 |
| 2007/0114512 A1* | 5/2007 | Kumaki | H01L 51/5052 257/13 |
| 2008/0093712 A1 | 4/2008 | Zenz | |
| 2009/0108984 A1* | 4/2009 | Choi | H01C 17/06533 338/22 R |
| 2010/0300528 A1* | 12/2010 | Fujii | B32B 7/12 136/256 |
| 2011/0090665 A1* | 4/2011 | Korony | H01C 1/148 361/821 |
| 2015/0014037 A1* | 1/2015 | Ahn | H01G 4/30 174/260 |
| 2015/0049510 A1* | 2/2015 | Haiberger | G02F 1/133603 362/612 |

FOREIGN PATENT DOCUMENTS

| | | |
|---|---|---|
| EP | 1858033 A1 | 11/2007 |
| GB | 1457318 A | 12/1976 |
| JP | S60031218 A | 2/1985 |
| JP | S61119333 U | 7/1986 |
| JP | S63009994 A | 1/1988 |
| JP | H01069038 A | 3/1989 |
| JP | H04105715 U | 9/1992 |
| JP | H0823005 A | 1/1996 |
| JP | 2005096405 A | 4/2005 |
| JP | 2007103505 A | 4/2007 |
| WO | 2009075530 A2 | 6/2009 |
| WO | 2012081815 A1 | 6/2012 |

* cited by examiner

ELECTRONIC COMPONENT AND USE THEREOF

The present invention relates to an electronic component, a system comprising an electronic component, and the use of an electronic component.

One object to be achieved is to specify an improved electronic component.

This object is achieved by means of the electronic component having the features of the independent patent claim. The dependent patent claims relate to advantageous configurations and developments.

A proposed electronic component comprises a functional body provided with a reflection structure, wherein the reflection structure is arranged and designed to reflect radiation that impinges on the electronic component from outside away from the functional body. Said reflection preferably relates to a reflection of radiation, in particular of electromagnetic radiation. The functional body of the electronic component is furthermore preferably essential to the function of the electronic component and the electronic properties thereof. Accordingly, the functional body is preferably not a housing or a component part that is unimportant for the function of the electronic component.

The reflection structure preferably has nonmetallic properties. The reflection structure can have one or a plurality of layers. Furthermore, the reflection structure preferably differs from lacquer layers or lacquers and/or solvent-containing coatings by virtue of a significantly higher thermal stability or thermal durability with regard to the mechanical, electronic and optical properties. By way of example, a melting point of the reflection structure can be above 1500° C. and thus far above temperatures at which lacquer coatings decompose and/or degrade in regard to the abovementioned properties.

The electronic component, in particular the reflection structure, advantageously makes it possible to increase the reflection of electromagnetic radiation that impinges on the electronic component from outside. In this way, for example, the luminous efficiency, the emitted light power and/or the optical efficiency of a device or component which together with the electronic component forms a functional unit can be increased, provided that the electronic component can optically interact with said device and/or can reflect radiation emitted or transmitted by the latter.

As a further advantage, the reflection structure of the electronic component makes it possible to prevent heating of the electronic component, for example by radiation emitted by said device, on account of the increased reflected radiation or reflection of radiation at the reflection structure. As a result, for example in the case where the electronic component is designed as an NTC component, the impairment of a temperature measurement can be prevented.

As one preferred configuration, the electronic component is a radiation-passive component. In the present case, the expression "radiation-passive" is intended to mean that the electronic component is not a component designed or set up for generating or for receiving electromagnetic radiation. The component preferably does not actively emit or generate electromagnetic radiation for example by means of charge carrier recombination. Preferably, the electronic component in this context is not an optoelectronic component. The component is preferably at least radiation-passive for radiation in the visible, ultraviolet and/or infrared spectral range. In particular, the component is preferably not a luminescence diode.

As one preferred configuration, the material of an outer surface of the reflection structure is electrically insulating. This configuration advantageously makes it possible to prevent a significant flow of electric current through the reflection structure, which is expedient particularly if the reflection structure is in contact with further electrically conductive materials, for example external electrodes, at an outer surface, since an undesired electrical short circuit between the component parts mentioned can be prevented.

As one preferred configuration, the functional body comprises a ceramic as functional element or consists of a ceramic. In accordance with this configuration, the electronic component can preferably be embodied as a varistor, a capacitor, a PTC component, an NTC component, or as a piezoelectric component.

As one preferred configuration, the electronic component is a varistor, a capacitor, a PTC component, an NTC component, a component containing ferrites, or a piezoelectric component.

As one preferred configuration, the functional body comprises a non-ceramic semiconductor material as functional element or consists of semiconductor material. In accordance with this configuration, the electronic component can preferably be embodied as a semiconductor component, for example as a diode.

As one preferred configuration, the reflection structure has a layer thickness of between 1 μm and 10 μm, preferably between 2 μm and 3 μm.

As one preferred configuration, the reflection structure has a greater reflection factor and/or reflectance than the functional body for radiation in a predefined spectral range that impinges on the electronic component from outside. This expediently enables an increased reflection of radiation, in particular of electromagnetic radiation, in contrast to the functional body.

The term "reflection factor" or "reflection co-efficient" can describe the amplitude ratio between a reflected and incident wave upon transition into a different propagation medium, that is to say for example from the external surroundings into the reflection structure. In this case, the amplitude preferably relates to the electric field strength of the corresponding electromagnetic wave.

The term "reflectance" or "reflectivity" can describe the ratio between reflected and incident intensity of an electromagnetic wave as energy variable.

As one preferred configuration, the predefined spectral range comprises the visible spectral range or consists thereof. The visible spectral range can define the predefined spectral range.

As one preferred configuration, the predefined spectral range comprises the infrared spectral range, the visible spectral range and the ultraviolet spectral range. The infrared spectral range is defined for example by the wavelength range of electromagnetic radiation between 1 mm and 780 nm. The visible spectral range is defined for example by the wavelength range of electromagnetic radiation (light spectrum) between 380 nm and 780 nm. By contrast, the ultraviolet spectral range is defined for example by the wavelength range of electromagnetic radiation between 100 nm and 380 nm.

As one preferred configuration, the reflection structure is designed in such a way that it has a reflection factor and/or reflectance of R>0.9 for radiation in the predefined spectral range that impinges on the electronic component from outside. As a result of this configuration, advantageously, radiation that impinges on the electronic component from outside can for the most part be reflected away from the functional body and electronic component, such that at the same time an absorption of said radiation by the functional body is largely prevented. Thus, as described above, for example the light power of a further device that optically interacts with the electronic component can be increased. In other words, the reflection structure can advantageously prevent a crucial proportion of the radiation that impinges on the electronic component from outside from being absorbed by the functional body. This affords advantages in particular with respect to ceramic bodies having dark surfaces.

As one preferred configuration, the electronic component has internal electrodes that are electrically insulated from one another and are arranged within the functional body. Preferably, said internal electrodes are largely arranged in the functional body or project into the latter. In this case, however, narrow or short regions of the internal electrodes that are necessary for an electrical contacting of the internal electrodes can protrude from the functional body or not be enclosed by the latter.

As one preferred configuration, the electronic component has external electrodes that are arranged outside the functional body. As a result of this configuration, for example, the internal electrodes can be electrically contacted and made accessible for an electrical connection of the electronic component.

As one preferred configuration, two external electrodes are electrically insulated from one another and electrically conductively connected to different internal electrodes that are electrically insulated from one another. This configuration is particularly expedient for a multiplicity of electronic components in particular multilayer components, comprising two main external electrodes and a multiplicity of internal electrodes.

As one preferred configuration, the external electrodes partly cover the reflection structure for example at end sides of the functional body. In this case, preferably, in comparison with further main surfaces of the electronic component, the end sides form small or smaller surfaces or have the latter.

As one preferred configuration, the reflection structure is at least partly arranged between the external electrodes and the functional body. In this case, the reflection structure is furthermore interrupted in electrode regions in which the external electrodes are electrically conductively connected to the internal electrodes. In accordance with this configuration, for example, before the functional body is provided with said external electrodes said functional body can firstly be coated or provided with the reflection structure. This configuration furthermore expediently enables the electrically conductive connection between the external electrodes and the internal electrodes in the electrode regions through the reflection structure.

As one preferred configuration, the reflection structure comprises a matrix material.

As one preferred configuration, the reflection structure comprises radiation-reflecting particles arranged in the matrix material of the reflection structure. As a result of this configuration, the above-described radiation can advantageously be scattered and/or reflected by said particles of the reflection structure.

As one preferred configuration, the radiation-reflecting particles consist of at least one of the materials titanium oxide, aluminum oxide, magnesium oxide, magnesium silicate, barium sulfate, zinc oxide and zirconium oxide or contain at least one of said materials.

In this context the expression "reflecting" can mean that the reflecting particles have a reflectivity and/or a reflectance or a reflection factor of preferably 0.9 (R>0.9) or more for electromagnetic radiation that impinges on them.

As one preferred configuration, the electronic component comprises a protective layer, which is arranged on the reflection structure. The protective layer is preferably designed to mechanically protect the electronic component against external influences of any type. As an alternative to this configuration, the reflection structure can intrinsically be configured as a protective layer or with—as described above—protective properties.

As one preferred configuration, the protective layer is radiation-transparent in the predefined spectral range.

As one preferred configuration, the protective layer consists of a glass or a resin, for example an epoxy, or comprises one of these materials.

In an alternative configuration, the protective layer is produced by chemical vapor deposition, for example plasma-enhanced chemical vapor deposition. In accordance with this configuration, the reflection structure can be provided for example with a smaller and/or accurately defined layer thickness or dimensioning.

As one preferred configuration, the protective layer has a layer thickness of between 10 nm and 1 µm. In accordance with this configuration, the protective layer has preferably been deposited or applied by means of chemical vapor deposition.

As one preferred configuration, the electronic component comprises a barrier layer, which is arranged between the functional body and the reflection structure. The barrier layer is preferably provided as a "material barrier" between the functional body and the reflection structure in order to prevent or restrict for example material diffusion from the functional body into the reflection layer and also from the reflection layer into the functional body. Particularly dopants of the functional body, without the barrier layer, for example during the process for producing the electronic device, could diffuse into the reflection layer and adversely affect the optical properties thereof. Conversely, pigments or other substances or constituents of the reflection layer could likewise diffuse into the functional body and adversely affect the electrical or dielectric properties thereof.

As one preferred configuration, the electronic component is designed to be surface-mountable and/or using "flip-chip" mounting.

As one preferred configuration, the reflection structure is producible or produced by dusting, spraying or screen printing.

In one configuration, the reflection structure only partly encloses the functional body along a circumference of the functional body, for example exclusively at individual sides and/or side faces of the functional body. As a result of this configuration, the reflecting or optical properties of the reflection structure can advantageously be utilized selectively only for individual sides or preferred directions of the functional body.

In one configuration the reflection structure completely encloses the functional body along a circumference of the functional body. The reflection structure can enclose or envelope the functional body for example at all side faces at which the functional body is not connected to the external electrodes. In this way, in particular, the reflecting properties of the reflection structure and the associated advantages can be utilized for all sides of the electronic component and/or of the functional body along a circumference of the electronic component and/or of the functional body. Furthermore, in contrast to the functional body being only partly enveloped with the reflection structure, this configuration affords the advantage that, under certain circumstances, during the population of a component part with the electronic component, a positionally correct arrangement or population can be dispensed with. In particular, the outlay for population can thus be optimized.

A further aspect of the present application relates to a system comprising a radiation-emitting device and the electronic component, wherein the system is designed in such a way that the reflection structure reflects radiation in the predefined spectral range that is emitted by the radiation-emitting device. Preferably, the radiation-emitting device is a light emitting diode ("LED" as an abbreviation "light emitting diode") or a device comprising light emitting diodes. Preferably said light emitting diodes emit visible light.

In one preferred configuration of the system, a pigment is arranged in the matrix material, wherein the pigment is designed to adapt the color of the electronic component to that of surroundings of the electronic component in the system.

In one preferred configuration of the system, the protective layer comprises a pigment, wherein the pigment is designed to adapt the color of the electronic component to that of surroundings of the electronic component in the system.

The pigment is expediently designed to color the electronic component and/or the protective layer in an arbitrary color of the visible electromagnetic spectrum or to engender a corresponding color stimulus for an observer of the electronic component.

The last two configurations make it possible to adapt the color and/or the external appearance of the electronic component for example to those/that of the system or of one or a plurality of component parts which, during the operation of the electronic component, interact therewith or are arranged alongside the latter. An overall impression that is uniform with regard to color, for example, can arise in this way. The pigment can for example contain a metal or consist thereof. Alternatively or additionally, the above-described radiation-reflecting particles can act as pigment.

In one preferred configuration of the system, the reflection structure is chosen such that the electrical, optical and/or mechanical properties of the reflection structure are stable over the lifetime of the radiation-emitting device. In particular, in this case preferably said properties are stable over a duration of 20000 hours of operation of the radiation-emitting device. In the present case, the expression "stable" is intended to mean that at least one of said properties is not crucially or significantly degraded or destroyed for example over the said duration, for example as a result of thermal influences during the operation of the radiation-emitting device or of the system.

A further aspect of the present application relates to the use of the electronic component for the system.

Further advantages, advantageous configurations and expediencies of the invention will become apparent from the following description of the exemplary embodiments in association with the figures.

Elements that are identical, of identical type and act identically are provided with identical reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

Figure 1A:
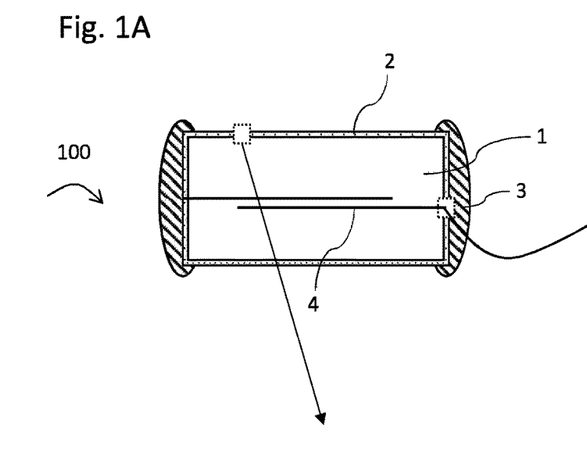
FIG. 1A shows a schematic sectional view of an electronic component.

FIG. 1A schematically shows a sectional view of an electronic component 100. The electronic component 100 is preferably radiation-passive, i.e. not an actively radiation-emitting component, such as a light emitting diode, for example. The electronic component 100 has a functional body 1. The functional body 1 is preferably the functional component part of either a varistor, a capacitor, a PTC component, an NTC component, a component containing ferrites, a piezoelectric component, or a semiconductor component. The functional body 1 can accordingly comprise a ceramic or consist thereof. Alternatively, the functional body 1 can comprise a preferably non-ceramic semiconductor material or consist thereof. Said semiconductor material can be or contain silicon (Si), germanium (Ge) or gallium arsenide (GaAs). Provided that the functional body is based on a semiconductor rather than on a ceramic, the electronic component 100 can be for example a diode, in particular an overvoltage protection diode and/or TVS diode ("TVS" as an abbreviation of "transient voltage suppressor" diode).

The functional body 1 is provided with a reflection structure 2. The reflection structure 2 is arranged and designed in such a way that electromagnetic radiation that impinges on the electronic component 100 from outside is reflected away from the functional body 1. The reflection structure 2, in particular the material of an outer surface of the reflection structure 2, is preferably designed to be electrically insulated, in order possibly to prevent an electrical contact between external electrodes (see below). The reflection structure 2 can be producible or produced by layer deposition methods, for example by dusting, spraying or screen printing. Preferably, the reflection structure 2 is a layer, for example a multiple layer or multilayer.

The electronic component 100 furthermore has electrodes or internal electrodes 4. Two partly overlapping internal electrodes extending from opposite sides (cf. end sides further below) of the electronic component 100 are depicted by way of example in FIG. 1A. Alternatively, a plurality of internal electrodes can also be provided. The internal electrodes 4 are expediently electrically insulated from one another. The internal electrodes 4 are preferably internal electrode layers or of layered design. The internal electrodes 4 are furthermore arranged for the most part within the functional body 1.

The electronic component 100 additionally has two electrodes or external electrodes 3, but even further external electrodes can also be provided. The external electrodes 3 are arranged outside the functional body 1. Furthermore, the external electrodes 3 are electrically insulated from one another. A respective external electrode is arranged or applied on an end side (cf. left and right sides in FIG. 1A) of the functional body 1 or of the electronic component 100.

Each of said internal electrodes 4 is electrically conductively connected in each case at an end side to an external electrode 3 arranged at said end sides.

FIG. 1A furthermore shows that the external electrodes 3 partly cover the reflection structure 2.

Figure 1B:
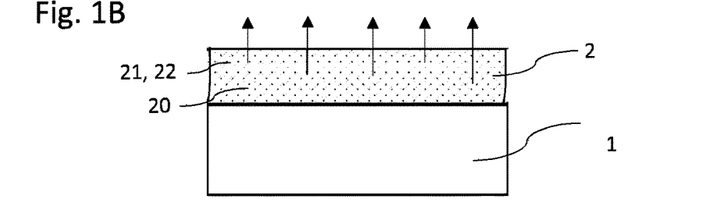
FIG. 1B shows an enlarged edge region of the electronic component from FIG. 1A.

FIG. 1B illustrates an edge section of the electronic component 100 in an enlarged view (cf. arrow pointing downward). It can be discerned that the reflection structure 2 comprises radiation-reflecting particles 21. Furthermore, the reflection structure 2 comprises a matrix material 20 for the radiation-reflecting particles 21. The radiation-reflecting particles 21 are expediently arranged in the matrix material. Electromagnetic radiation that impinges on the electronic component 100 or on the reflection structure 2 from outside is preferably reflected or returned by the radiation-reflecting particles 21, which is indicated by the arrows pointing upward that are illustrated in FIG. 1B. In this case, the radiation can at least partly penetrate into the reflection structure 2 or the matrix material 20 until it is preferably reflected away from the functional body 1 by one or a plurality of the radiation-reflecting particles 21.

In accordance with the embodiment shown in FIG. 1B, the reflection structure 2 has preferably been deposited by means of a spraying method. For this purpose, firstly a slip composition comprising the matrix material or a base material therefor and the radiation-reflecting particles 21 as pigment, that is to say coloring or color-defining substance, can be prepared or mixed in order then to be applied to the functional body jointly for the purpose of forming or depositing the reflection structure.

The filling factor or filling proportion of the radiation-reflecting particles 21 in the matrix material 20 can be between 5% and 50%. Preferably, said filling factor is between 5% and 30%. These indications can relate to percentages by volume and also percentages by mass or weight.

The radiation-reflecting particles 21 can consist of at least one of the materials titanium oxide, for example $TiO_2$ aluminum oxide, for example $Al_2O_3$, magnesium oxide, for example MgO, magnesium silicate, for example $MgO_3Si$, barium sulfate, for example $BaSO_4$, zinc oxide, for example ZnO and zirconium oxide, for example $ZrO_2$, or contain at least one of said materials. The matrix material 20 preferably comprises a resin, for example an epoxy, or a glass or consists of one of said materials.

Preferably, a pigment 22 is arranged in the matrix material 20. The pigment 22 is preferably designed to adapt the color of the electronic component to that of surroundings of the electronic component, for example in a system (see below). The pigment 22 is expediently furthermore designed to color the electronic component in an arbitrary color of the visible electromagnetic spectrum or to engender a corresponding color stimulus for an observer of the electronic component. As described above, in the case where the pigment 22 is arranged in the matrix material 20, the pigment 22 can also be made available by the radiation-reflecting particles 21. By way of example, a starting material for the matrix material 20 is provided or admixed with the pigment 22 during the production of the electronic component 100, wherein the pigment can be extruded into a starting substance of the matrix material. By way of example, the pigment can contain cobalt (Co) in order, under certain circumstances, in accord with a system, the radiation-emitting device (see below) or some other component part, to engender a bluish color as color stimulus for the observer or user of the electronic component 100. Alternatively, a different pigment can be chosen in order to obtain a different color impression.

Figure 1C:
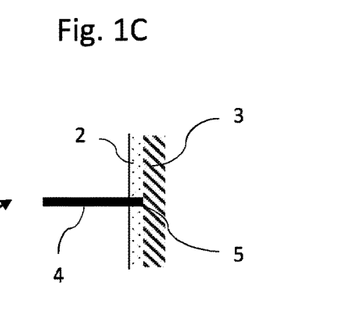
FIG. 1C shows a further edge region of the electronic component from FIG. 1A in enlarged form.

FIG. 1C shows an edge region, in particular an electrode region, of the electronic component 100 in an enlarged illustration (cf. arrow pointing toward the right). The illustration in FIG. 1C is by way of example for one of the end sides of the functional body 1 or of the electronic component 100. It can be discerned in FIG. 1C that the reflection structure 2 is interrupted in electrode regions 5 in which the external electrodes 3 are electrically conductively connected to the internal electrodes 4. Apart from the electrode regions 5, the reflection structure 2 can for example completely cover the functional body 1. For the interruption of the reflection structure 2, in the method for producing the electronic component, said reflection structure can be etched for example by an etching method and further electrode material can be arranged in the electrode regions 5 in a subsequent method step.

Figure 1D:
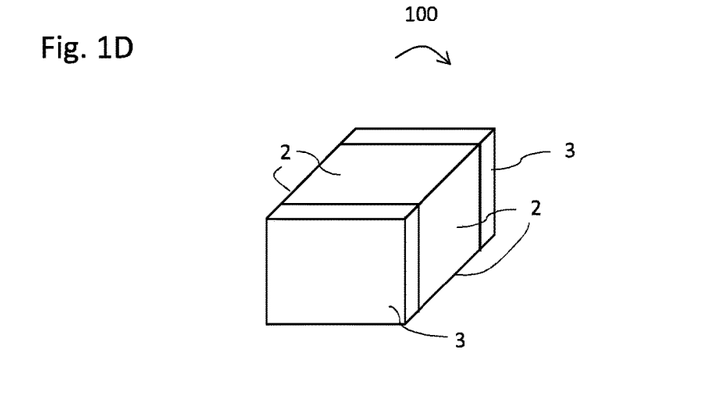
FIG. 1D shows a schematic, perspective view of the electronic component.

FIG. 1D shows a schematic, perspective view of the electronic component 100 such as is shown for example in FIGS. 1A to 1C. The functional body 1 can be configured, as illustrated, in polygonal fashion, for example in parallelepipedal fashion. Alternatively, the functional body can have a different shape. It can furthermore be discerned that the reflection structure 2 completely envelopes or encloses the functional body 1 (not explicitly identified in FIG. 1D) apart from at the end sides thereof, the external electrodes 3 being arranged at said end sides, for example over all four side faces, such that in particular the reflecting properties of the reflection structure 2 and the associated advantages, can be utilized for all sides along the circumference of the electronic component 100. Alternatively, the reflection structure 2 can only partly enclose the functional body 1 along a circumference of the functional body 1, preferably along a circumference that does not extend over the external electrodes 3 and/or end sides 1, for example exclusively at individual side faces of the functional body 1 (cf. top and bottom sides of the functional body 1 in FIG. 1A).

Figure 2A:
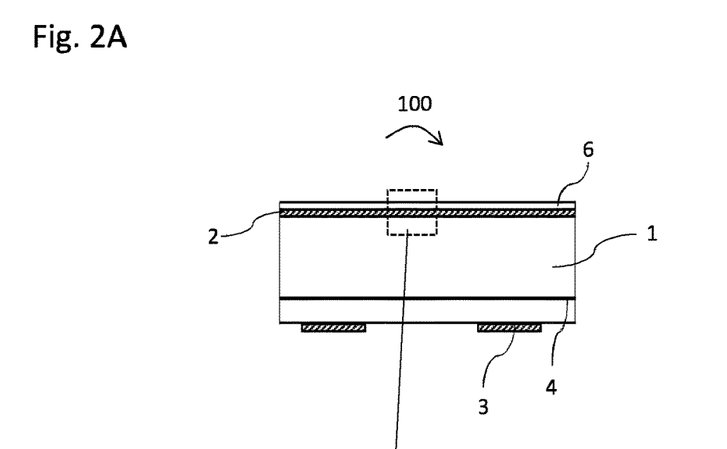
FIG. 2A schematically shows at least a partial view of an electronic component in accordance with an alternative embodiment.

FIG. 2A shows the electronic component 100 in an alternative configuration. In contrast to the figures described previously, the electronic component 100 has a protective layer 6, which is arranged at an outer side on the reflection structure 2. Accordingly, the protective layer 6 preferably defines an outer surface of the electronic component 100. By way of example, the protective layer 6 can protect the functional body 1 against reactive and/or corrosive media to which said functional body is exposed for example during the production of the electronic component 100.

As an alternative or in addition to the configurations described, the protective layer 6 can comprise the pigment 22. Analogously (cf. description above) to the matrix material, the protective layer 6 can be provided or admixed with the pigment 22.

Furthermore, the protective layer 6 can be produced by chemical vapor deposition (CVD as an abbreviation of "chemical vapor deposition"), for example plasma-enhanced chemical vapor deposition (PECVD denoting "plasma-enhanced" CVD). The protective layer 6 can furthermore have a layer thickness of between 10 nm and 1 μm. Particularly preferably, the layer thickness in this case is between 10 nm and 50 nm.

In contrast to FIGS. 1A, 1B and 1C, furthermore, no electrodes arranged within the functional body 1 are shown. Instead, an internal electrode 4 is shown, which extends at an opposite side of the functional body 1 relative to the reflection structure 2 over the entire width of the reflection structure 2. The electrode 4 is electrically conductively connected to further external electrodes or electrodes 3—illustrated by way of example. The electrodes 3 are electrically conductively connected to the electrodes 4 on a side thereof facing away from the functional body. In accordance with this configuration, the electronic component 100 can be designed or configured to be for example surface-mountable and/or using "flip-chip" mounting, for example by the electronic component 100 being directly soldered, by means of the electrodes 3, onto a printed circuit board or some other component part or being electrically conductively connected thereto in some other way. Alternatively or additionally, the electronic component 100 can be designed as an LGA system, for example via the electrodes 3 and 4. "LGA" is an abbreviation of "land grid array". In the case of the LGA system, the connections of an electronic device or circuit are embodied on the underside thereof in the form of a checkered array ("grid array") of lands. It is closely related to the BGA system ("ball grid array"), which uses solder beads or solder balls for an electrical contacting.

Figure 2B:
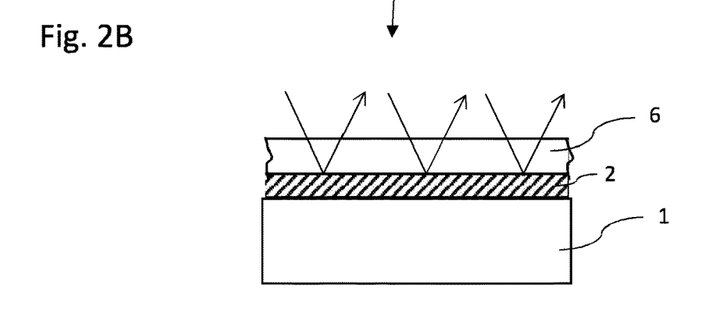
FIG. 2B shows an enlarged edge region of the electronic component from FIG. 2A.

An edge region of the electronic component 100 provided with the reflection structure 2 is illustrated in an enlarged view in FIG. 2B. It can be discerned that a protective layer 6 is applied or arranged on the reflection structure 2, that is to say on an outer side of the electronic component 100. The protective layer 6 is preferably radiation-transparent. Furthermore, the protective layer 6 preferably comprises an epoxy or a glass or consists of one of these materials. The protective layer 6 can comprise the above-described pigment 22, without this being explicitly illustrated in the figures. In accordance with this configuration, furthermore, the reflection structure 2, as a continuous layer, for example, can completely consist of one of the materials mentioned in connection with the radiation-reflecting particles 21 or comprise one of said materials. The arrows illustrated indicate—in a manner similar to that in FIG. 1B—the reflection of radiation that impinges on the electronic component 100 from outside, said radiation being reflected by the reflection structure 2.

Figure 2C:
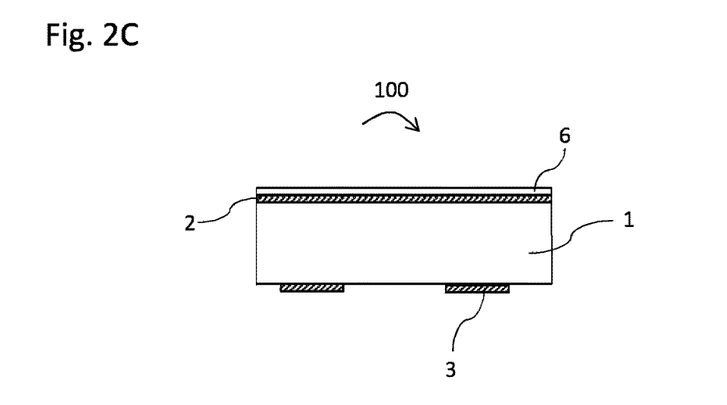
FIG. 2C schematically shows at least a partial view of an electronic component in accordance with a further alternative embodiment.

FIG. 2C shows, in contrast to FIG. 2A, a configuration of the electronic component or of a part thereof, wherein the functional body preferably comprises a semiconductor material, in particular a non-ceramic semiconductor material. In contrast to FIG. 2A, here no internal electrodes 4 are provided in the functional body 1, since this is not expedient in the case of a non-ceramic functional body.

Figure 3:
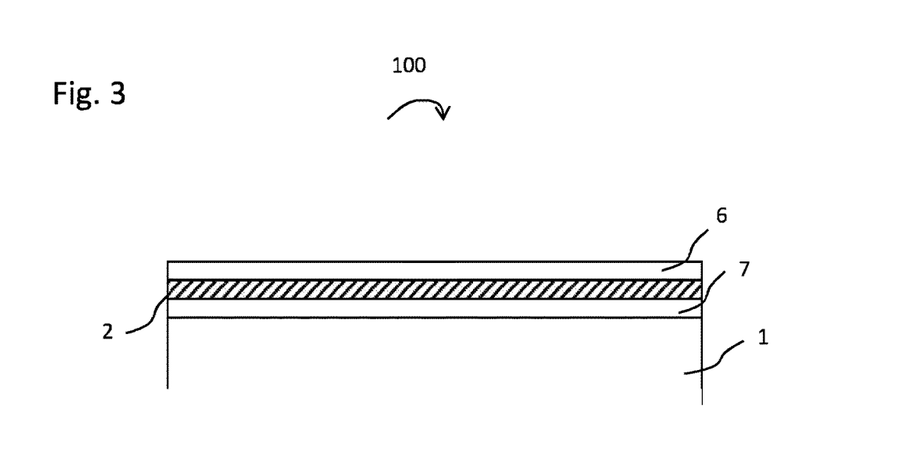
FIG. 3 shows a schematic sectional or side view of an electronic component in accordance with a further embodiment.

FIG. 3 shows a schematic side or sectional view of the electronic component 100 in a further configuration. In contrast to the configurations described above, the electronic component 100 has a barrier layer 7 arranged between the functional body 1 and the reflection structure. The barrier layer is preferably composed of lead silicate or boron silicate, but can additionally or alternatively also consist of a different material. As in FIGS. 2A and 2B, here the protective layer 6 is arranged on the reflection structure. However, in accordance with this configuration, said protective layer can also be omitted, such that the reflection structure defines the outer surface (not explicitly identified) of the electronic component 100.

In accordance with the embodiment shown in FIG. 2B and FIG. 3, respectively, the reflection structure 2 and/or the barrier layer 7 is preferably producible or produced by a screen printing method.

The reflection structure 2 can have overall a layer thickness of less than 50 µm. Preferably, the reflection structure has a layer thickness of between 1 µm and 10 µm. Particularly preferably, the reflection structure 2 has a layer thickness of between 2 µm and 3 µm.

Preferably, in the present case the reflection structure 2 has a greater reflection factor and/or reflectance than the functional body 1 for electromagnetic radiation in a predefined spectral range that impinges on the electronic component 100 from outside. The predefined spectral range can comprise the infrared spectral range, the visible spectral range and the ultraviolet spectral range or, preferably, define the visible spectral range.

In the present case, the reflection structure 2 is preferably designed in such a way that it has a reflection factor and/or reflectance of R>0.9 for radiation in the predefined spectral range that impinges on the electronic component from outside. Alternatively, the reflection structure 2 can be designed in such a way that it has a reflection factor and/or reflectance of R>0.7 or for example R>0.8 for radiation in the predefined spectral range that impinges on the electronic component from outside.

In accordance with a further embodiment which is not shown explicitly in the figures, the reflection structure of the electronic component comprises a layer sequence, for example comprising a plurality of individual layers arranged one on top of another. In accordance with this configuration, a reflection of electromagnetic radiation that impinges on the electronic component from outside can be effected by optical interference and/or Bragg reflection for example spectrally or wavelength-selectively, at the reflection structure. Expediently, the reflection structure is correspondingly designed for this purpose. In particular, the individual layers of the reflection structure can be configured to be radiation-transparent. Adjacent layers can likewise have a high difference in refractive index, as in the case of a Bragg mirror, for example. In this sense, said layer sequence can consist for example of two different materials arranged or applied alternately one above the other. In accordance with this configuration, said layers of the layer sequence can likewise at least partly consist of the materials mentioned above in association with the radiation-reflecting particles, preferably without $TiO_2$, and be deposited by dusting or cathode sputtering.

Figure 4:
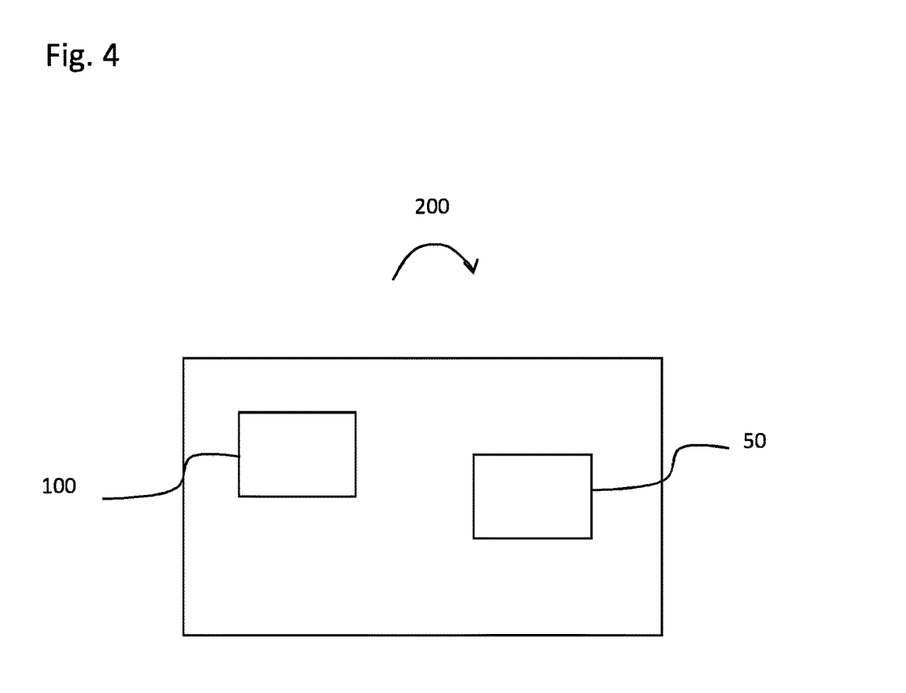
FIG. 4 schematically shows a system comprising an electronic component.

FIG. 4 shows a schematic view of a system 200. The system 200 comprises a radiation-emitting device 50. Furthermore, the system 200 comprises the electronic component 100 in accordance with at least one of the embodiments shown with reference to the figures described further above.

The system 200 is preferably designed in such a way that the reflection structure 2 reflects electromagnetic radiation in the predefined spectral range that is emitted by the radiation-emitting device 50. For this purpose, the electronic component is preferably arranged relative to the radiation-emitting device 50 in such a way that an optical interaction between said component parts is possible. In particular, the electronic component 100 can be arranged in an emission region or beam path of the radiation-emitting device 50. Furthermore, the reflection structure 2 (see above) is preferably chosen such that the electrical, optical and/or mechanical properties of the reflection structure are stable over the lifetime of the radiation-emitting device 50. In particular, in this case, preferably said properties are stable over a duration of 20000 hours of operation of the radiation-emitting device 100 or of the system 200.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

LIST OF REFERENCE SIGNS

1 Functional body
2 Reflection structure
3 External electrode
4 Internal electrode
5 Electrode region
6 Protective layer
7 Barrier layer
20 Matrix material
21 Radiation-reflecting particles
22 Pigment
50 Radiation-emitting device
100 Electronic component
200 System

The invention claimed is:

1. An electronic component comprising:
a functional body comprising a reflection structure,
wherein the reflection structure is arranged and designed to reflect radiation, that impinges on the electronic component from outside, away from the functional body,
wherein the electronic component is radiation-passive, and
wherein the reflection structure comprises radiation-reflecting particles arranged in a matrix material of the reflection structure.

2. The electronic component according to claim 1, wherein the material of an outer surface of the reflection structure is electrically insulating.

3. The electronic component according to claim 1, wherein the functional body comprises a ceramic as functional element.

4. The electronic component according to claim 1, wherein the functional body comprises a non-ceramic semiconductor material as functional element.

5. The electronic component according to claim 1, wherein the reflection structure has a layer thickness of between 1 µm and 10 µm.

6. The electronic component according to claim 1, wherein the reflection structure has a greater reflection factor or reflectance than the functional body for radiation in a predefined spectral range that impinges on the electronic component from outside, and
wherein the predefined spectral range comprises the visible spectral range or consists of the visible spectral range.

7. The electronic component according to claim 1, wherein the reflection structure is designed in such a way that it has a reflection factor or reflectance of R>0.9 for radiation that impinges on the electronic component from outside.

8. The electronic component according to claim 1, which has internal electrodes that are electrically insulated from one another and are arranged within the functional body, and external electrodes that are arranged outside the functional body, wherein two external electrodes are electrically insulated from one another and electrically conductively connected to different internal electrodes that are electrically insulated from one another.

9. The electronic component according to claim 8, wherein the reflection structure is at least partly arranged between the external electrodes and the functional body and interrupted in electrode regions in which the external electrodes are electrically conductively connected to the internal electrodes.

10. The electronic component according to claim 1, wherein the electronic component comprises a protective layer, which is arranged on the reflection structure.

11. The electronic component according to claim 10, wherein the protective layer is radiation-transparent and consists of a glass or a resin, for example an epoxy, or comprises one of these materials.

12. The electronic component according to claim 10, wherein the protective layer has a layer thickness of between 10 µm and 1 µm.

13. The electronic component according to claim 1, wherein the electronic component comprises a barrier layer, which is arranged between the functional body and the reflection structure.

14. The electronic component according to claim 1, wherein the reflection structure only partly encloses the functional body along a circumference of the functional body.

15. The electronic component according to claim 1, wherein the reflection structure completely encloses the functional body along a circumference of the functional body.

16. The electronic component according to claim 1, which is a varistor, a capacitor, a PTC component, an NTC component, a piezoelectric component, a component containing ferrites, or a semiconductor component.

17. The electronic component according to claim 1, which is designed to be surface-mountable and/or using "flip-chip" mounting.

18. An electronic component comprising:
a functional body comprising a reflection structure,
wherein the reflection structure is arranged and designed to reflect radiation, that impinges on the electronic component from outside, from the functional body,
wherein the electronic component is radiation-passive,
wherein the reflection structure has a greater reflection factor or reflectance than the functional body for radiation in a predefined spectral range that impinges on the electronic component from outside, and
wherein the predefined spectral range comprises the visible spectral range or consists of the visible spectral range.

19. An electronic component comprising:
a functional body comprising a reflection structure,
wherein the reflection structure is arranged and designed to reflect radiation, that impinges on the electronic component from outside, away from the functional body,
wherein the electronic component is radiation-passive, and
wherein the reflection structure is designed in such a way that it has a reflection factor or reflectance of R>0.9 for radiation that impinges on the electronic component from outside.

* * * * *